(12) United States Patent
Bao et al.

(10) Patent No.: US 10,832,975 B2
(45) Date of Patent: Nov. 10, 2020

(54) REDUCED STATIC RANDOM ACCESS MEMORY (SRAM) DEVICE FOOT PRINT THROUGH CONTROLLED BOTTOM SOURCE/DRAIN PLACEMENT

(71) Applicant: INTERNATIONAL BUSINESS MACHINES CORPORATION, Armonk, NY (US)

(72) Inventors: Ruqiang Bao, Niskayuna, NY (US); Brent A. Anderson, Jericho, VT (US); Junli Wang, Slingerlands, NY (US); Kangguo Cheng, Schenectady, NY (US); Choonghyun Lee, Rensselaer, NY (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/006,187

(22) Filed: Jun. 12, 2018

(65) Prior Publication Data

US 2019/0378767 A1    Dec. 12, 2019

(51) Int. Cl.
| | |
|---|---|
| *H01L 21/8238* | (2006.01) |
| *H01L 27/092* | (2006.01) |
| *H01L 29/08* | (2006.01) |
| *H01L 29/06* | (2006.01) |
| *H01L 29/78* | (2006.01) |

(Continued)

(52) U.S. Cl.
CPC .. *H01L 21/823885* (2013.01); *H01L 21/2251* (2013.01); *H01L 21/324* (2013.01);
(Continued)

(58) Field of Classification Search
CPC ......... H01L 21/823885; H01L 29/1083; H01L 21/2251; H01L 21/324; H01L 21/823892;
(Continued)

(56) References Cited

U.S. PATENT DOCUMENTS

| 5,998,879 A | 12/1999 | Iwaki et al. |
|---|---|---|
| 8,735,972 B2 | 5/2014 | Anderson et al. |

(Continued)

FOREIGN PATENT DOCUMENTS

| DE | 112010004330 T5 | 9/2012 |
|---|---|---|
| KR | 20020021284 A | 3/2002 |

*Primary Examiner* — Mohammad M Hoque
(74) *Attorney, Agent, or Firm* — Tutunjian & Bitetto, P.C.; Douglas Pearson

(57) ABSTRACT

A method of reducing the distance between co-linear vertical fin field effect devices is provided. The method includes forming a first vertical fin on a substrate, forming a second vertical fin on the substrate, and depositing a masking block in the gap between the first vertical fin and second vertical fin. The method further includes depositing a spacer layer on the substrate, masking block, first vertical fin, and second vertical fin, depositing a protective liner on the spacer layer, and removing a portion of the protective liner from the spacer layer on the masking block and substrate adjacent to the first vertical fin. The method further includes removing a portion of the spacer layer from a portion the masking block and a portion of the substrate adjacent to the first vertical fin, and growing a first source/drain layer on an exposed portion of the substrate and first vertical fin.

10 Claims, 10 Drawing Sheets

(51) Int. Cl.
 *H01L 21/324* (2006.01)
 *H01L 21/225* (2006.01)
 *H01L 29/10* (2006.01)
 *H01L 27/11* (2006.01)

(52) U.S. Cl.
 CPC ........ *H01L 21/823814* (2013.01); *H01L 21/823878* (2013.01); *H01L 21/823892* (2013.01); *H01L 27/092* (2013.01); *H01L 29/0649* (2013.01); *H01L 29/0847* (2013.01); *H01L 29/1083* (2013.01); *H01L 29/7827* (2013.01); *H01L 27/1104* (2013.01)

(58) Field of Classification Search
 CPC ......... H01L 21/823878; H01L 29/7827; H01L 29/0649; H01L 29/0847; H01L 27/092; H01L 21/823814; H01L 27/1104
 See application file for complete search history.

(56) References Cited

U.S. PATENT DOCUMENTS

| | | |
|---|---|---|
| 9,711,511 B1 | 7/2017 | Lim et al. |
| 9,721,957 B2 | 8/2017 | Nakanishi et al. |
| 10,043,900 B1* | 8/2018 | Bi ................... H01L 29/7827 |
| 2007/0007601 A1 | 1/2007 | Hsu et al. |
| 2016/0064549 A1* | 3/2016 | Tsai ................... H01L 29/7813 257/288 |
| 2017/0358672 A1* | 12/2017 | Anderson ............ H01L 29/785 |
| 2018/0033793 A1 | 2/2018 | Balakrishnan et al. |
| 2018/0069004 A1* | 3/2018 | Cheng ................ H01L 27/0922 |
| 2019/0088767 A1* | 3/2019 | Xie ................... H01L 29/66545 |
| 2019/0189521 A1* | 6/2019 | Li ................... H01L 21/823885 |
| 2019/0229200 A1* | 7/2019 | Lee ................ H01L 21/823842 |

\* cited by examiner

REDUCED STATIC RANDOM ACCESS MEMORY (SRAM) DEVICE FOOT PRINT THROUGH CONTROLLED BOTTOM SOURCE/DRAIN PLACEMENT

BACKGROUND

Technical Field

The present invention generally relates to vertical transport fin field effect transistor (VT FinFET) devices, and more particularly to controlling the placement of adjacent source/drains for VT FinFET devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of reducing the distance between co-linear vertical fin field effect devices is provided. The method includes forming a first vertical fin on a substrate, forming a second vertical fin on the substrate, wherein the first vertical fin is co-linear with the second vertical fin, and depositing a masking block in the gap between the first vertical fin and second vertical fin. The method further includes depositing a spacer layer on the substrate, masking block, first vertical fin, and second vertical fin. The method further includes depositing a protective liner on the spacer layer, and removing a portion of the protective liner from the spacer layer on the masking block and substrate adjacent to the first vertical fin. The method further includes removing a portion of the spacer layer from a portion the masking block and a portion of the substrate adjacent to the first vertical fin, and growing a first source/drain layer on an exposed portion of the substrate and first vertical fin.

In accordance with another embodiment of the present invention, a pair of co-linear vertical fin field effect devices is provided. The pair of devices includes a first vertical fin on a first bottom source/drain, and a second vertical fin on a second bottom source/drain, wherein the first vertical fin is co-linear with the second vertical fin. The pair of devices further includes an inactive separation region between an edge of the first bottom source/drain and an edge of the second bottom source/drain, and a lightly doped region in the substrate under the inactive separation region and between the first bottom source/drain and second bottom source/drain.

In accordance with yet another embodiment of the present invention, a pair of co-linear vertical fin field effect devices is provided. The pair of devices includes a first vertical fin on a substrate, a second vertical fin on the substrate, wherein the first vertical fin is co-linear with the second vertical fin, and an isolation region in the substrate between the first vertical fin and second vertical fin. The pair of devices further includes a first bottom source/drain on the substrate adjacent to the first vertical fin, wherein the first bottom source/drain does not surround the first vertical fin, and a second bottom source/drain on the substrate adjacent to the second vertical fin, wherein the second bottom source/drain does not surround the second vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Forming a blocking mask between two co-linear fins can help control the placement of adjacent source/drains for vertical transport fin field effect transistor (VT FinFET) devices. Placement of the blocking mask between two fins can allow formation of an n-type bottom source/drain adjacent to a first vertical fin and a p-type bottom source/drain adjacent to a second vertical fin with an inactive separation region between the n-type bottom source/drain and neighboring p-type bottom source/drain. In other embodiments, the blocking mask can be replaced by a masking layer section.

Use of a masking block between the two vertical fins can reduce the distance between two co-linear vertical fins by eliminating the likelihood of electrically shorted bottom source/drains due to overlapping lithography masks through. Forming a masking block having a width less than the distance between two co-linear vertical fins can avoid issues relating to lithographic mask alignment, while preventing formation of electrically shorted bottom source/drains for adjacent vertical fins.

A lightly doped p-n-junction can be formed in the substrate between two co-linear vertical fins through controlled diffusion of dopants from an n-type bottom source/drain and neighboring p-type bottom source/drain into the substrate below an inactive separation region. The lightly doped p-n-junction can reduce or prevent current leakage between the neighboring VT FinFET devices without use of a shallow trench isolation region, so the n-type VT FinFET and p-type VT FinFET can be electrically isolated by the lightly doped p-n-junction.

Exemplary applications/uses to which the present invention can be applied include, but are not limited to: static random access memory (SRAM) devices.

Figure 1:
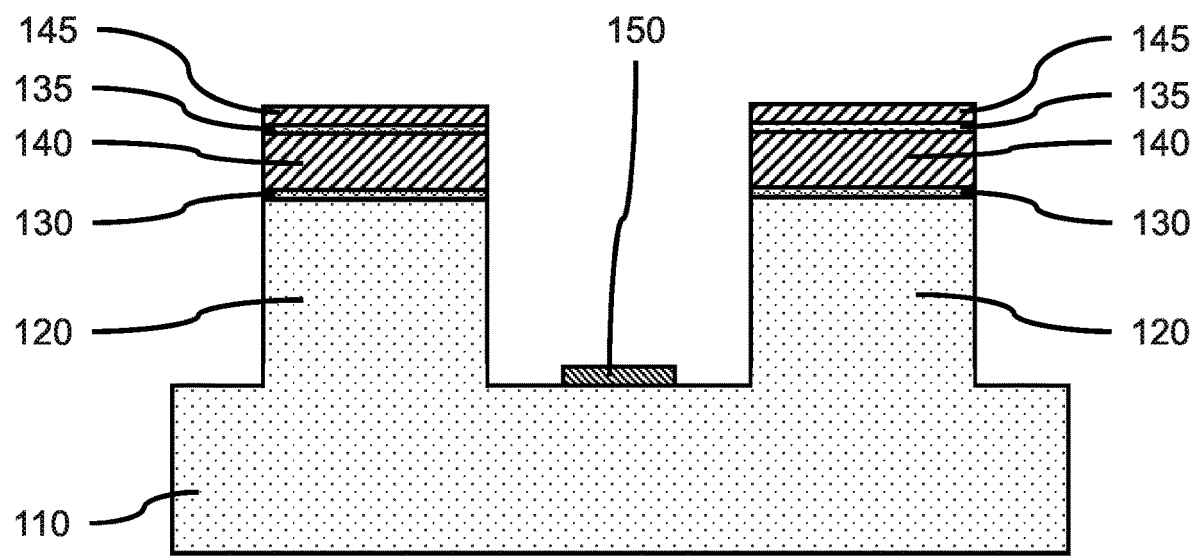
FIG. 1 is a cross-sectional side view showing the long axis of two neighboring co-linear vertical fins with a masking block formed between the neighboring vertical fins, in accordance with an embodiment of the present invention.

Referring now to the drawings in which like numerals represent the same or similar elements and initially to FIG. 1, a cross-sectional side view showing the long axis of two neighboring co-linear vertical fins with a masking block formed between the neighboring vertical fins is shown, in accordance with an embodiment of the present invention.

In one or more embodiments, a plurality of vertical fins 120 can be formed on a substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 120 may be formed by a direct write process or double patterning process using, for example, immersion lithography, extreme ultraviolet lithography, or x-ray lithography.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, a fin template can be formed on the vertical fins as part of the patterning process. The fin template can include a template buffer layer 130 on the top surface of the vertical fins 120, a first hardmask layer 140 on the template buffer layer 130, an intermediate template layer 135 on the first hardmask layer 140, and a second hardmask layer 145 on the intermediate template layer 135.

In various embodiments, each of the template buffer layer 130, first hardmask layer 140, intermediate template layer 135, and second hardmask layer 145 can be made of a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof. The template buffer layer 130 and intermediate template layer 135 can be a different material from the first hardmask layer 140 and second hardmask layer 145 to provide etch selectivity between each of the layers.

In a non-limited exemplary embodiment, the template buffer layer 130 and intermediate template layer 135 can be silicon oxide ($SiO_x$) and the first hardmask layer 140 and second hardmask layer 145 can be silicon nitride ($Si_xN_y$).

In various embodiments, the vertical fins 120 can be co-linear along the long axis of the vertical fins (i.e., in a column) with a gap between the end walls of the vertical fins. The gap distance can be in the range of about 10 nanometers (nm) to about 100 nm, or in a range of about 20 nm to about 60 nm, about 20 nm to about 40 nm, or about 25 nm to about 35 nm.

In one or more embodiments, vertical fins 120 can be laterally adjacent to each other (i.e., in a row), where the adjacent and co-linear vertical fins can form an array (row× column). The adjacent vertical fins can be separated by a distance in a range of about 10 nm to about 50 nm, or in a range of about 20 nm to about 40 nm, although other distances are also contemplated.

In one or more embodiments, a masking block 150 can be formed in the gap between two co-linear vertical fins 120. The masking block 150 can be formed by a blanket deposition of a masking layer, and a lithographic process and etching process to remove portions of the masking layer not in the gap between the vertical fins 120.

In one or more embodiments, the masking block 150 can be a dielectric material. In various embodiments, the masking block 150 can be silicon oxide ($SiO_x$). The masking block 150 can undergo a post-formation nitridation to form a silicon oxynitride ($Si_xO_yN_z$), where the masking block material is different from the layers of the fin template.

In various embodiments, the masking block 150 can have a thickness in the range of about 1 nm to about 50 nm, or in a range of about 5 nm to about 20 nm.

Figure 2:
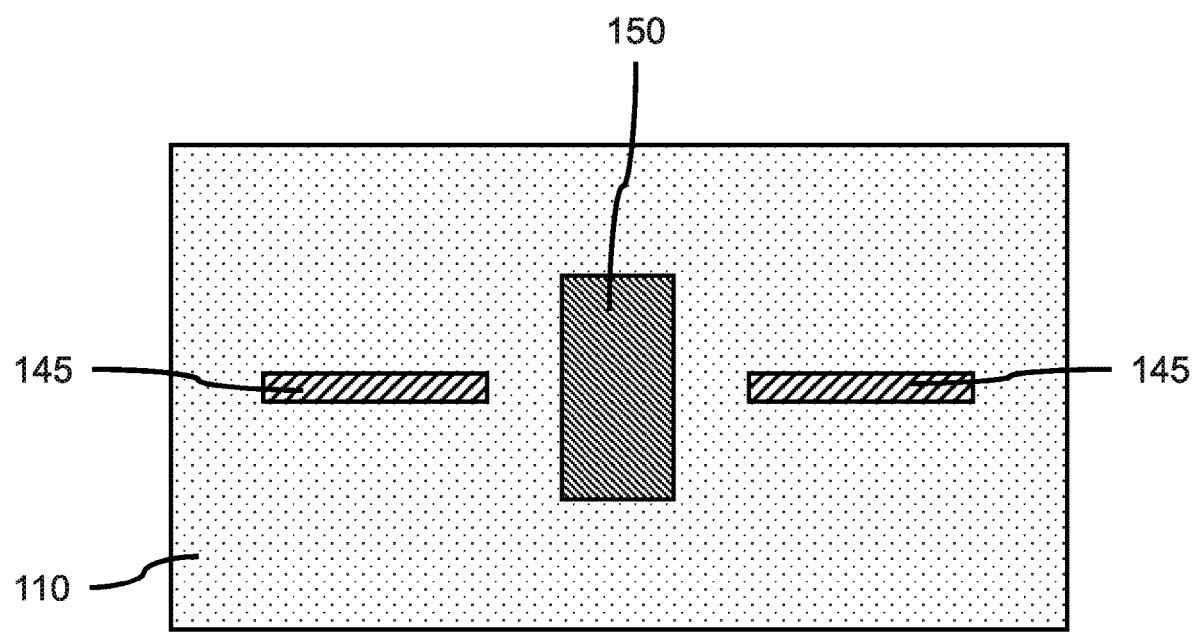
FIG. 2 is a top view showing the masking block formed between the two neighboring co-linear vertical fins, in accordance with an embodiment of the present invention.

FIG. 2 is a top view showing the masking block formed between the two neighboring co-linear vertical fins, in accordance with an embodiment of the present invention.

In various embodiments, the masking block 150 can be configured and dimensioned to form a rectangle that extends beyond the sidewalls of each vertical fin 120, while leaving spaces between the edges of the masking block 150 and the end wall of each vertical fin 120.

In various embodiments, the masking block 150 can have a length (in a long direction orthogonal to the co-linear vertical fins) in the range of about 10 nm to about 1000 nm, or in a range of about 20 nm to about 500 nm, although other lengths are also contemplated. The masking block 150 can have a length greater than an intended width of a bottom source/drain to be formed around the vertical fins 120.

In various embodiments, the masking block 150 can have a width (in a short direction parallel with the co-linear vertical fins) in the range of about 5 nm to about 50 nm, or in a range of about 10 nm to about 30 nm, although other lengths are also contemplated. The width of the masking block can be less than the distance between the end faces of the neighboring co-linear vertical fins, where the masking layer section prevent formation of bottom source/drains.

In various embodiments, the end faces of the neighboring co-linear vertical fins can be separated by a distance in a range of about 10 nm to about 100 nm, or in a range of about 20 nm to about 60 nm, although other distances are also contemplated.

Figure 3:
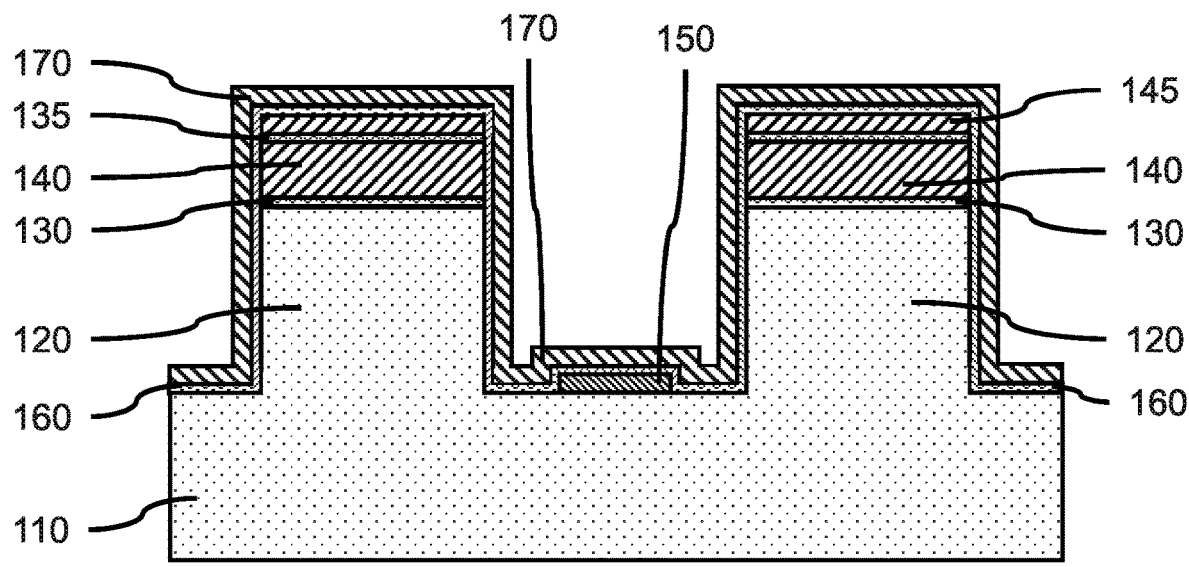
FIG. 3 is a cross-sectional side view showing the long axis of two neighboring co-linear vertical fins with a spacer layer on the vertical fins and masking block, and a protective liner on the spacer layer, in accordance with an embodiment of the present invention.

FIG. 3 is a cross-sectional side view showing the long axis of two neighboring co-linear vertical fins with a spacer layer on the vertical fins and masking block, and a protective liner on the spacer layer, in accordance with an embodiment of the present invention.

In one or more embodiments, a spacer layer 160 can be formed on the exposed surface of the substrate 110, the exposed surfaces of the vertical fins 120, and the layers of the fin templates, where the spacer layer 160 can be formed by a conformal deposition, for example, atomic layer deposition (ALD), plasma enhanced ALD (PEALD), or a combination thereof.

In various embodiments, the spacer layer 160 can have a thickness in the range of about 1 nm to about 20 nm, or in a range of about 2 nm to about 10 nm, although other thicknesses are also contemplated. The thickness of the spacer layer 160 can determine a height of the sidewalls and end walls of a vertical fin 120 that becomes exposed when the adjoining spacer layer 160 is removed.

In various embodiments, the spacer layer 160 can be a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof. The spacer layer 160 can be a different material from the masking block 150 and the first and second hardmask layers 140, 145.

In one or more embodiments, a protective liner 170 can be formed on the spacer layer 160, where the protective liner 170 can be formed by a conformal deposition (e.g., ALD, PEALD).

In various embodiments, the protective liner 170 can be a dielectric material selected from the same materials as the spacer layer 160. The protective liner 170 can be a different material from the spacer layer 160 and masking block 150 to allow selective removal.

In a non-limiting exemplary embodiment, the spacer layer 160 can be silicon oxide ($SiO_x$), and the protective liner 170 can be silicon nitride ($Si_xN_y$).

In various embodiments, the protective liner 170 can have a thickness in the range of about 1 nm to about 20 nm, or in a range of about 2 nm to about 10 nm, although other thicknesses are also contemplated. The thickness of the protective liner 170 can be the same as, less than, or greater than the thickness of the spacer layer 160. In one or more embodiments, the spacer layer 160 can cover the surface of the substrate 110 around the vertical fin 120, and the sidewalls of the vertical fin.

Figure 4:
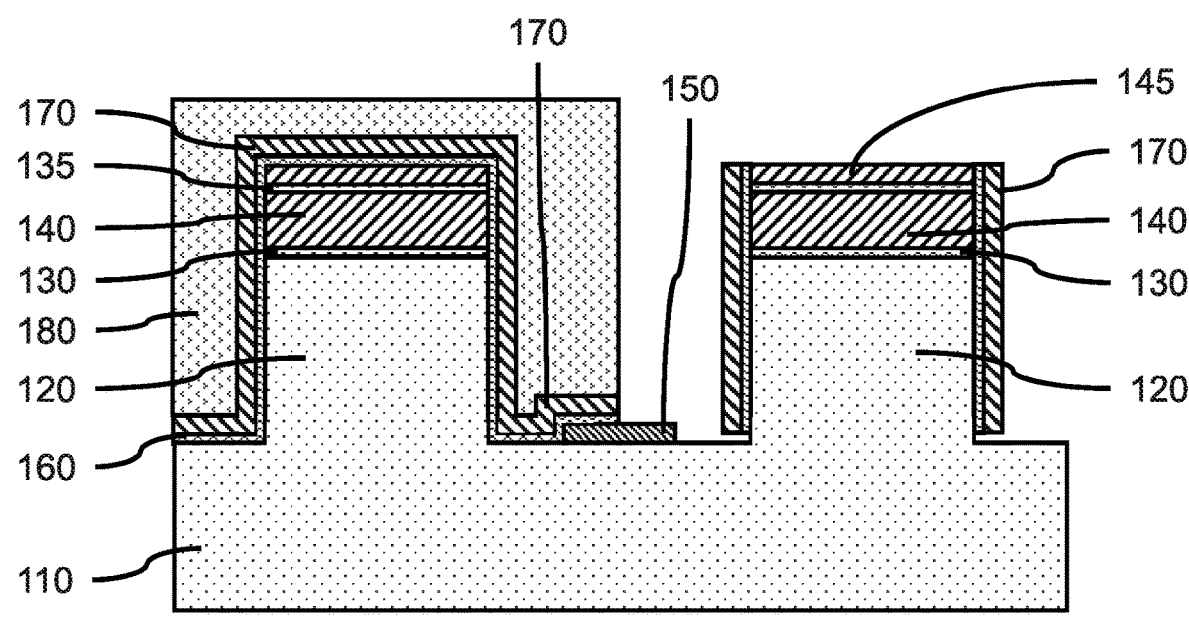
FIG. 4 is a cross-sectional side view showing the long axis of two neighboring co-linear vertical fins with a cover block on a vertical fin and portion of the masking block, and an uncovered vertical fin with a portion of the spacer layer and protective liner removed, in accordance with an embodiment of the present invention.

FIG. 4 is a cross-sectional side view showing the long axis of two neighboring co-linear vertical fins with a cover block on a vertical fin and portion of the masking block, and an uncovered vertical fin with a portion of the spacer layer and protective liner removed, in accordance with an embodiment of the present invention.

In one or more embodiments, a cover layer can be formed on the vertical fins 120, where the cover layer can be formed by a blanket deposition, for example, chemical vapor deposition (CVD), plasma enhanced CVD (PECVD), physical vapor deposition (PVD), spin-on, or a combination thereof. In various embodiments, a portion of the cover layer on a first vertical fin 120 can be removed through a lithographic and etching process to form a cover block 180 on a second vertical fin 120 and a portion of the masking block 150. Portions of the protective liner 170 on the first vertical fin 120 and on the masking block 150 can be exposed. The cover block 180 can cover a portion of the protective liner on the masking block 150.

In various embodiments, the cover block 180 can be a multi-layered material including an organic planarization material on the underlying layers, a hardmask layer (e.g., a dielectric material (e.g., SiO, SiN) a silicon antireflection coating (SiARC) or a titanium antireflection coating (TiARC)), and a lithographic resist material for patterning the hardmask layer. The multi-layered material can be patterned and etched to form the cover block 180 over a predetermined portion of the substrate and vertical fins.

In one or more embodiments, the portions of the protective liner 170 exposed by the cover block 180 can be removed, where the portions of the protective liner 170 can be removed by a selective, directional etch, for example a reactive ion etch (RIE). The reactive ion etch can remove portions of the protective liner 170 on surfaces approximately orthogonal to the direction of the ion beam, such that portions of the protective liner 170 can remain on the sidewalls and end walls of the first vertical fin 120, while portions of the protective liner on the masking block 150 and fin template can be removed. Removal of the portions of the protective liner can expose underlying portions of the spacer layer 160.

In one or more embodiments, exposed portions of the spacer layer 160 can be removed using an isotropic etch, for example, a wet chemical etch, a dry plasma etch, or a combination thereof. The isotropic etch can remove portions of the spacer layer 160 on the lower portions of the sidewalls and end walls of the vertical fin 120 shadowed by portions of the protective liner 170. Removal of the shadowed portions of the spacer layer 160 can expose the lower portions of the vertical fin 120. Removal of portions of the spacer layer 160 can also expose a portion of the masking block 150 not covered by the cover block 180. In various embodiments, the cover block can prevent removal of the protective liner 170 from the second vertical fin 120.

In various embodiments, the lower portion of the vertical fin 120 can be exposed by removal of the spacer layer 160 on the substrate and adjoining the sidewalls and end walls of the vertical fin 120. The thickness of the spacer layer 160 can determine the height of the vertical fin 120 that is exposed.

Figure 5:
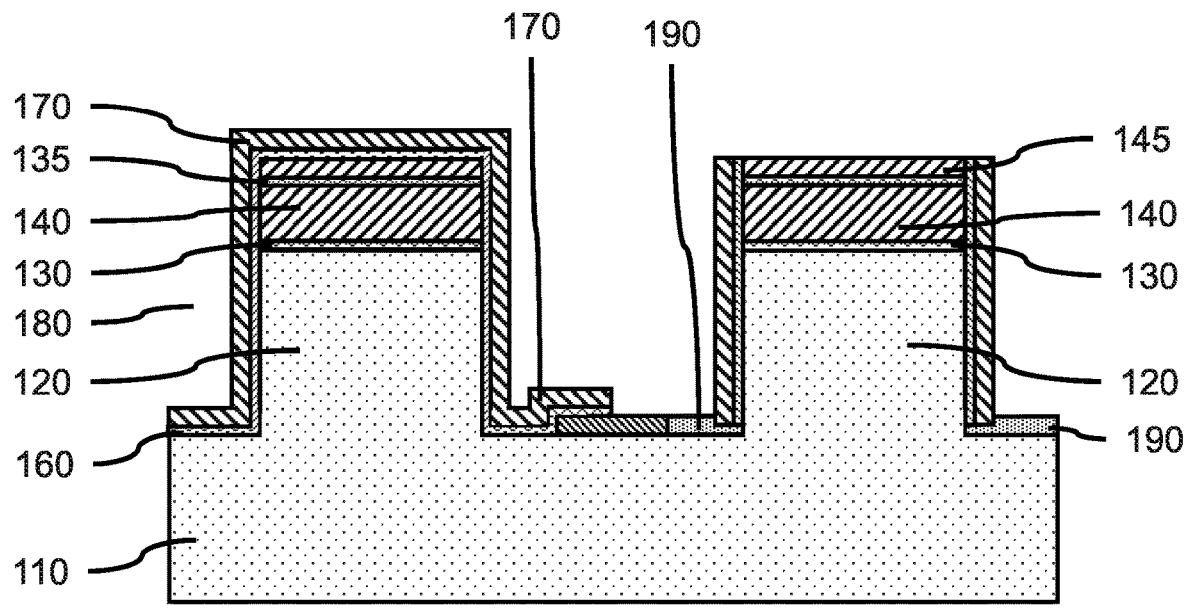
FIG. 5 is a cross-sectional side view showing the long axis of two neighboring co-linear vertical fins with a first bottom source/drain layer on the substrate and a first vertical fin, in accordance with an embodiment of the present invention.

FIG. 5 is a cross-sectional side view showing the long axis of two neighboring co-linear vertical fins with a first bottom source/drain layer on the substrate and a first vertical fin, in accordance with an embodiment of the present invention.

The cover block 180 can be removed before formation of the first bottom source/drain layer 190, where the cover block can be removed by a selective etch.

In one or more embodiments, a first bottom source/drain layer 190 can be formed on the surface of the substrate 110 exposed by removal of the spacer layer 160 from around the vertical fin 120. The first bottom source/drain layer 190 can be formed by epitaxial or heteroepitaxial growth on a crystalline surface of the substrate 110. The first bottom source/drain layer 190 can be a semiconductor material (e.g., Si, SiC, SiGe, Ge, etc.) having the same crystal structure and orientation as the underlying substrate 110. The first bottom source/drain layer 190 can be doped to form an n-type or p-type bottom source/drain. The first bottom source/drain layer 190 can have a dopant concentration in a range of about $5 \times 10^{19}$ cm$^{-3}$ to about $8 \times 10^{20}$ cm$^{-3}$.

In various embodiments, the first bottom source/drain layer 190 can be a semiconductor material, including, but not limited to n-type (e.g., P or As) doped silicon (Si) or p-type (e.g., B) doped silicon-germanium (SiGe).

In various embodiments, the masking block 150 can prevent formation of the first bottom source/drain layer 190 in a predefined region of the gap between the co-linear vertical fins 120.

In various embodiments, the first bottom source/drain layer 190 can have a thickness in the range of about 5 nm to about 50 nm, or in a range of about 20 nm to about 40 nm.

In various embodiments, the first bottom source/drain layer 190 is not formed adjacent to the vertical fin covered by the protective liner 170 and spacer layer 160.

In various embodiments, the first bottom source/drain layer 190 is formed adjacent to the vertical fin 120. The first bottom source/drain layer 190 can be formed to a thickness that is greater than the height of the exposed lower portion of the vertical fin 120, such that a step can be formed in the first bottom source/drain layer 190 that extends above the bottom of the protective liner 170 on the sidewalls and end walls.

Figure 6:
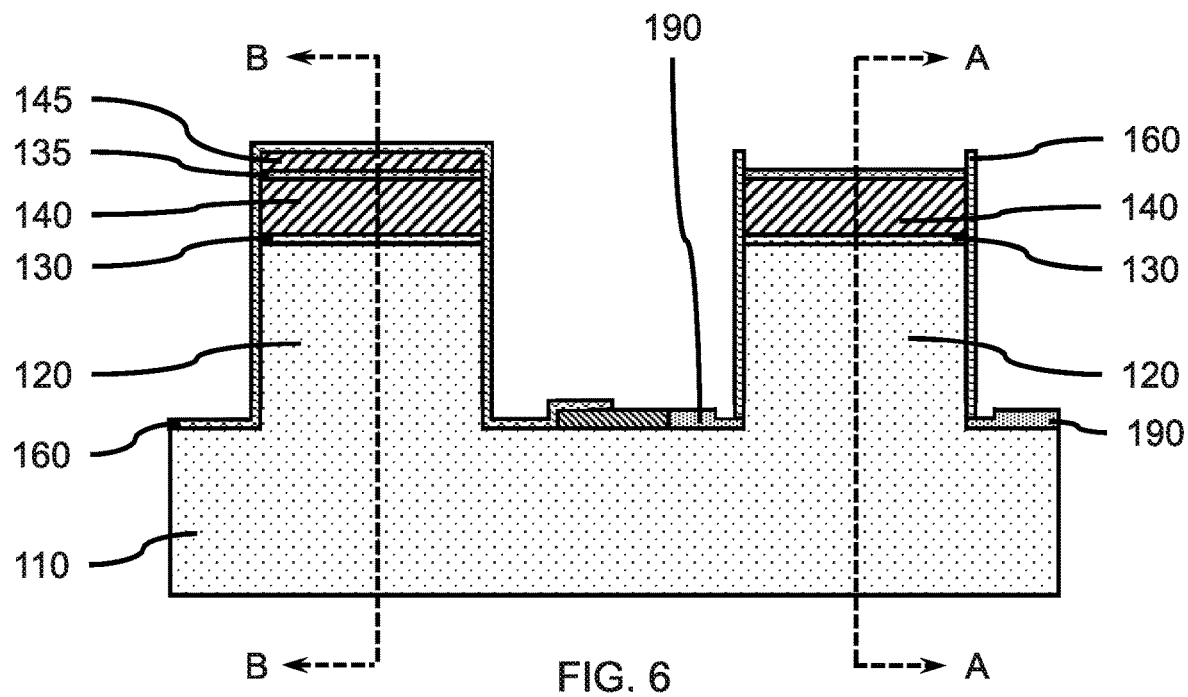
FIG. 6 is a cross-sectional side view showing the long axis of two neighboring co-linear vertical fins with a first bottom source/drain layer on the substrate and a first vertical fin after removing the protective liner, in accordance with an embodiment of the present invention.

FIG. 6 is a cross-sectional side view showing the long axis of two neighboring co-linear vertical fins with a first bottom source/drain layer on the substrate and a first vertical fin after removing the protective liner, in accordance with an embodiment of the present invention.

In one or more embodiments, the protective liner 170 can be removed from the vertical fins 120 to expose the underlying portions of the spacer layer 160. A portion of the second hardmask layer 145 may also be removed, where the second hardmask layer 145 and protective liner are the same material, (e.g., silicon nitride ($Si_xN_y$)), such that the intermediate template layer 135 can be exposed. Removal of the protective liner can expose a step in the first bottom source/drain layer.

Figure 7:
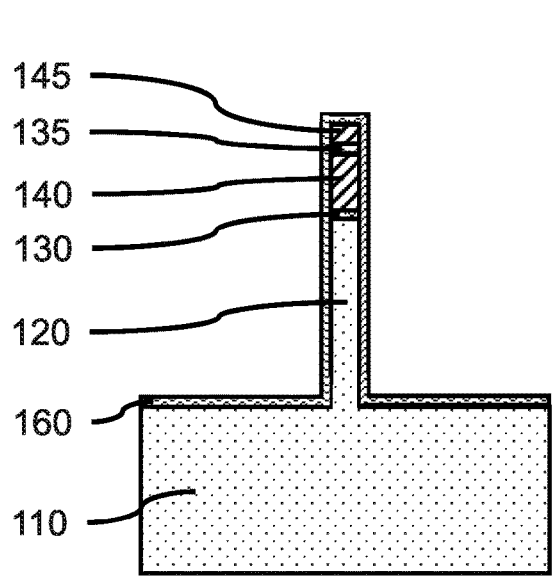
FIG. 7 is a cross-sectional side view showing the BB section view of the vertical fin in FIG. 14 after removing the protective liner, in accordance with an embodiment of the present invention.
Figure 14:
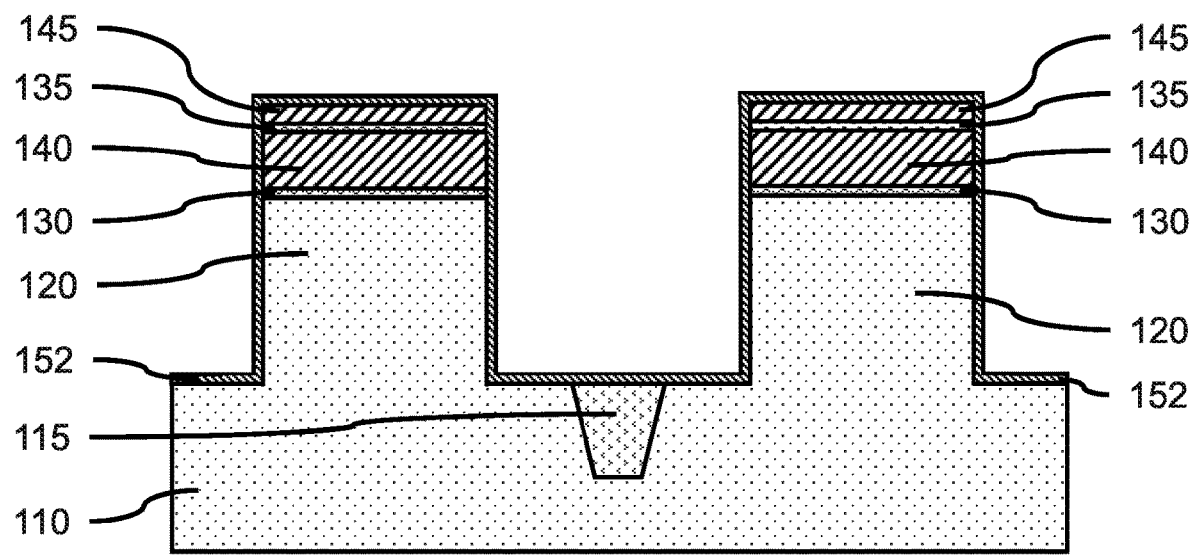
FIG. 14 is a cross-sectional side view showing the long axis of two neighboring co-linear vertical fins with fin templates on each of the vertical fins, and a masking layer on the vertical fins, substrate, and isolation region, in accordance with another embodiment of the present invention.

FIG. 7 is a cross-sectional side view showing the BB section view of the vertical fin in FIG. 14 after removing the protective liner, in accordance with an embodiment of the present invention.

The spacer layer 160 and fin template layers can still be on the second vertical fin 120.

Figure 8:
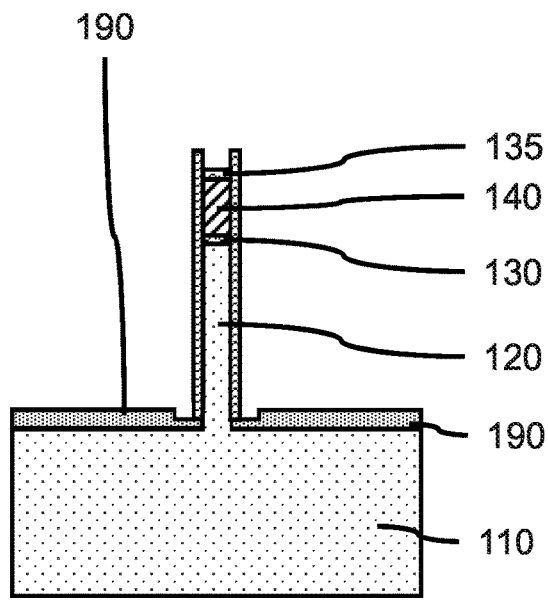
FIG. 8 is a cross-sectional side view showing the AA section view of the vertical fin and bottom source/drain layer in FIG. 14 after removing the protective liner, in accordance with an embodiment of the present invention.

FIG. 8 is a cross-sectional side view showing the AA section view of the vertical fin and bottom source/drain layer in FIG. 14 after removing the protective liner, in accordance with an embodiment of the present invention.

The intermediate template layer 135 can be exposed after removing the protective liner 170 and second hardmask layer 145. A step formed in the first bottom source/drain layer 190 can be exposed adjacent to the remaining portions of the spacer layer 160.

Figure 9:
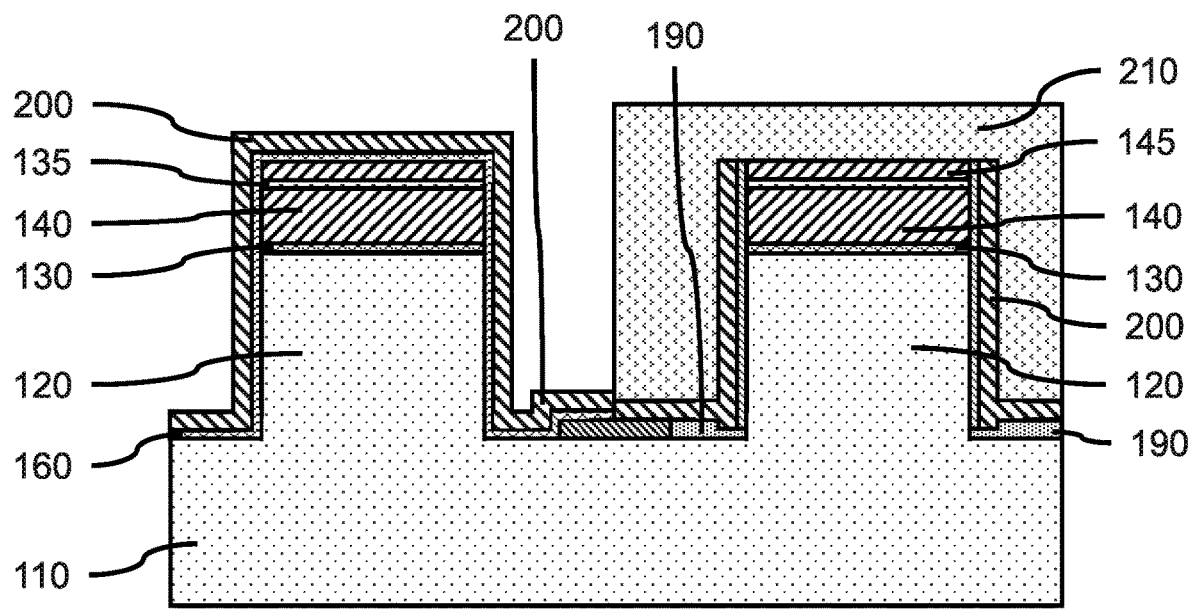
FIG. 9 is a cross-sectional side view showing the long axis of two neighboring co-linear vertical fins with a second protective liner and second cover block on the first bottom source/drain layer and first vertical fin, in accordance with an embodiment of the present invention.

FIG. 9 is a cross-sectional side view showing the long axis of two neighboring co-linear vertical fins with a second protective liner and second cover block on the first bottom source/drain layer and first vertical fin, in accordance with an embodiment of the present invention.

In one or more embodiments, a second protective liner 200 can be formed on the remaining portions of the spacer layer 160 on the first and second vertical fins 120 by a conformal deposition.

In various embodiments, the second protective liner 200 can be a dielectric material selected from the same materials as the spacer layer 160. The second protective liner 200 can be a different material from the spacer layer 160 and masking block 150 to allow selective removal. In a non-limiting exemplary embodiment, the second protective liner 200 can be silicon nitride ($Si_xN_y$).

In various embodiments, the second protective liner 200 can have a thickness in the range of about 1 nm to about 10 nm, or in a range of about 2 nm to about 8 nm.

In various embodiments, a second cover block 210 can be formed on the second protective liner 200 and first vertical fin 120, where the second cover block 210 can be on the portion of the masking block 150 previously exposed by the first masking block. The second protective liner 200 can cover the spacer layer 160 on the second vertical fin. The second cover block 210 can cover the first bottom source/drain layer 190 around the first vertical fin 120.

Figure 10:
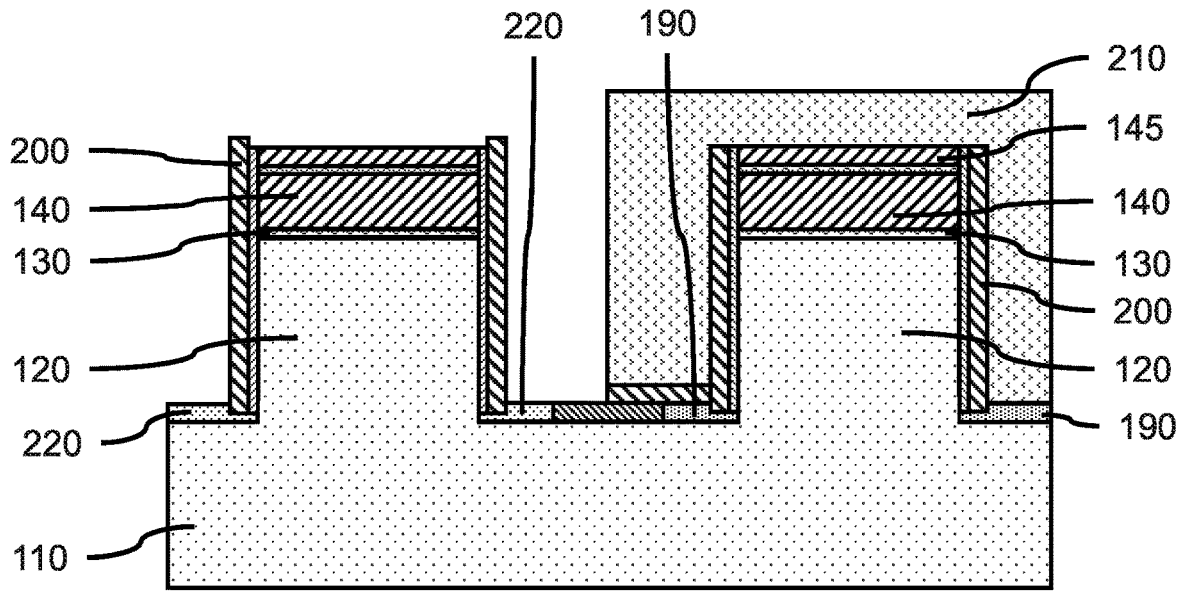
FIG. 10 is a cross-sectional side view showing the long axis of two neighboring co-linear vertical fins with a second bottom source/drain layer formed on the second vertical fin after removing portions of the second protective liner and spacer layer, in accordance with an embodiment of the present invention.

FIG. 10 is a cross-sectional side view showing the long axis of two neighboring co-linear vertical fins with a second bottom source/drain layer formed on the second vertical fin after removing portions of the second protective liner and spacer layer, in accordance with an embodiment of the present invention.

In one or more embodiments, the portions of the second protective liner 200 exposed by the second cover block 210 can be removed, where the portions of the second protective liner 200 can be removed by a selective, directional etch, for example a reactive ion etch (RIE). Removal of the portions of the second protective liner 200 can expose underlying portions of the spacer layer.

In one or more embodiments, exposed portions of the spacer layer 160 can be removed using an isotropic etch, for example, a wet chemical etch, a dry plasma etch, or a combination thereof. The isotropic etch can remove portions of the spacer layer 160 on the lower portions of the sidewalls and end walls of the second vertical fin 120 shadowed by the remaining portions of the second protective liner 200. Removal of the shadowed portions of the spacer layer 160 can expose the lower portions of the second vertical fin 120. Removal of portions of the spacer layer 160 can also expose a portion of the masking block 150 not covered by the second cover block 210.

The second cover block 210 can be removed before formation of the second bottom source/drain layer 220, where the second cover block can be removed by a selective etch.

In one or more embodiments, a second bottom source/drain layer 220 can be formed on the surface of the substrate 110 exposed by removal of the spacer layer 160 from around the vertical fin 120. The second bottom source/drain layer 220 can be formed by epitaxial or heteroepitaxial growth on a crystalline surface of the substrate 110. The second bottom source/drain layer 220 can be n-doped or p-doped. The second bottom source/drain layer 220 can have a dopant concentration in a range of about $5\times10^{19}$ cm$^{-3}$ to about $8\times10^{20}$ cm$^{-3}$.

In various embodiments, the masking block 150 can prevent formation of the second bottom source/drain layer 220 in a predefined region of the gap between the co-linear vertical fins 120, where an inactive separation region be between the second bottom source/drain layer 220 and first bottom source/drain layer 190.

In various embodiments, the second bottom source/drain layer 220 can be a semiconductor material, including, but not limited to n-type (e.g., P or As) doped silicon (Si) or p-type (e.g., B) doped silicon-germanium (SiGe), where the second bottom source/drain layer 220 can be a different material from the first bottom source/drain layer and have the opposite dopant type.

In various embodiments, the second bottom source/drain layer 220 can have a thickness in the range of about 5 nm to about 50 nm, or in a range of about 20 nm to about 40 nm, although other thicknesses are also contemplated.

In various embodiments, the second bottom source/drain layer 220 is formed adjacent to the second vertical fin 120. The second bottom source/drain layer 220 can be formed to a thickness that is greater than the height of the exposed lower portion of the vertical fin 120, such that a step can be formed in the second bottom source/drain layer 220 that extends above the bottom of the second protective liner 200 on the sidewalls and end walls. In various embodiments, the second cover block 210 can prevent removal of the second protective liner 200 from the first vertical fin.

Figure 11:
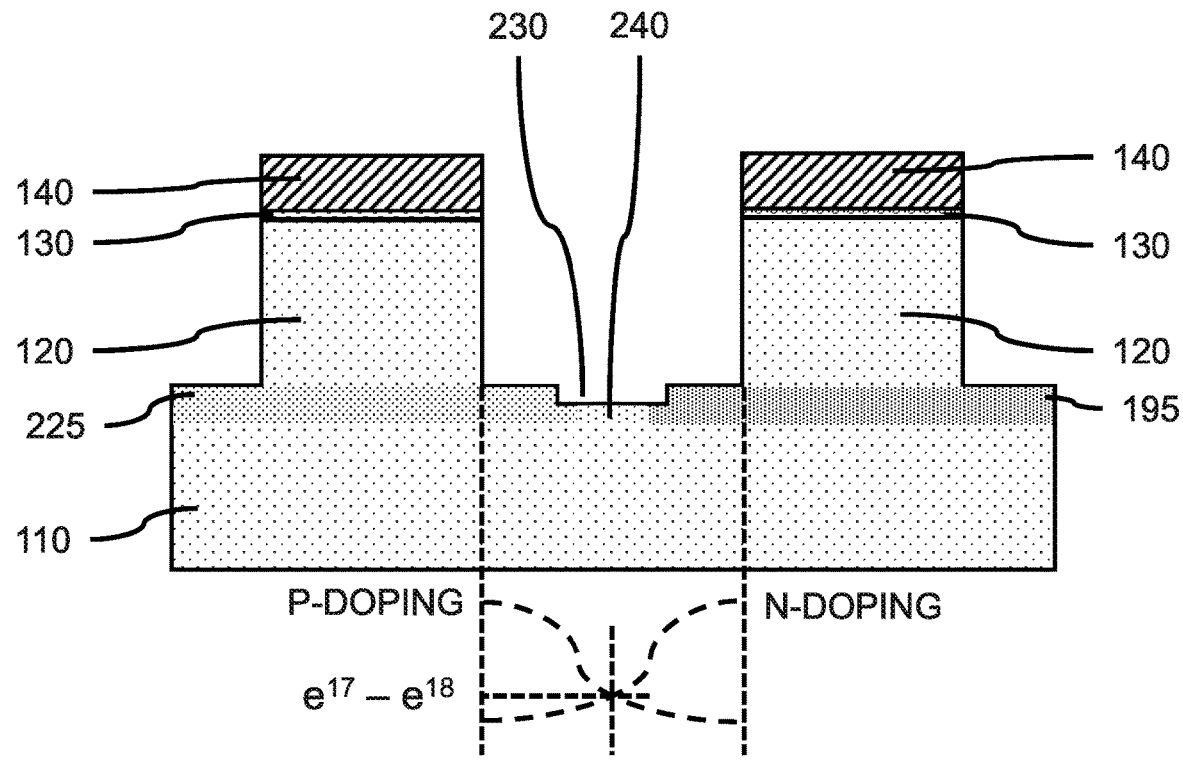
FIG. 11 is a cross-sectional side view showing the long axis of two neighboring co-linear vertical fins with bottom source/drains after removing the second protective liner and spacer layer, and diffusing the n-type and p-type dopants into a lightly doped junction region, in accordance with an embodiment of the present invention.

FIG. 11 is a cross-sectional side view showing the long axis of two neighboring co-linear vertical fins with bottom source/drains after removing the second protective liner and spacer layer, and diffusing the n-type and p-type dopants into a lightly doped junction region 240, in accordance with an embodiment of the present invention.

In one or more embodiments, the second protective liner 200 and remaining spacer layer 160 can be removed using selective etches to expose the masking block 150, second bottom source/drain layer 220, and first bottom source/drain layer 190.

In various embodiments, the masking block 150 can be removed using a selective etch to form an inactive separation region 230 between the edges of the first bottom source/drain layer 190 and second bottom source/drain layer 220, where the inactive separation region 230 is a section of the gap between the co-linear vertical fins that does not have a doped layer on it.

In one or more embodiments, the vertical fins 120, first bottom source/drain layer 190 and second bottom source/drain layer 220 can be heat treated to diffuse dopants from the first bottom source/drain layer 190 and second bottom source/drain layer 220 into the adjacent vertical fin 120 and substrate 110. A lightly doped region 240 can be formed in the substrate between the first bottom source/drain layer 190 and second bottom source/drain layer 220 and under the inactive separation region 230, where the lightly doped region 240 can form a p-n-junction that electrically separates a p-type VT FinFET from an n-type VT FinFET. In various embodiments, the lightly doped region can have a combined n-doping and p-doping concentration in a range of about $1\times10^{17}$ to about $1\times10^{18}$ at a minimum interface point.

In various embodiments, dopants from the second bottom source/drain layer 220 can diffuse into the lower adjoining portion of the second vertical fin 120 and substrate 110 to form a second bottom source/drain 225. The dopants can be n-type or p-type.

In various embodiments, dopants from the first bottom source/drain layer 190 can diffuse into the lower adjoining portion of the first vertical fin 120 and substrate 110 to form a first bottom source/drain 195. The dopants can be n-type or p-type for form an n-type or p-type VT FinFET. In various embodiments, the first bottom source/drain 195 can include n-type dopants to form an n-type VT FinFET, and the second bottom source/drain 225 can include p-type dopants to form an p-type VT FinFET. The n-type VT FinFET and p-type VT FinFET can form a CMOS device.

Figure 12:
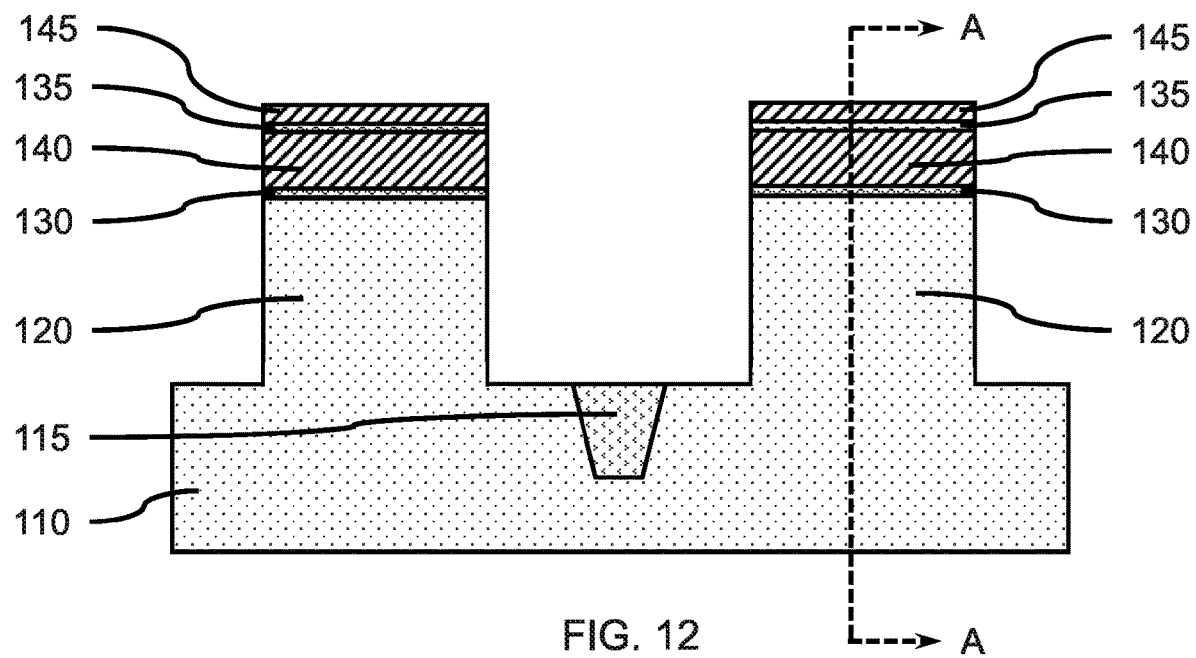
FIG. 12 is a cross-sectional side view showing the long axis of two neighboring co-linear vertical fins with fin templates on each of the vertical fins, and an isolation region between the vertical fins, in accordance with another embodiment of the present invention.

FIG. 12 is a cross-sectional side view showing the long axis of two neighboring co-linear vertical fins with fin templates on each of the vertical fins, and an isolation region between the vertical fins, in accordance with another embodiment of the present invention.

In other embodiments, the neighboring co-linear vertical fins 120 and adjacent vertical fins 120 can form an array on the substrate with an isolation region 115 formed in the substrate 110. The isolation region 115 can be formed by removing a portion of the substrate to form a trench using lithographic techniques and etching, and filling the trench with a dielectric material.

Figure 13:
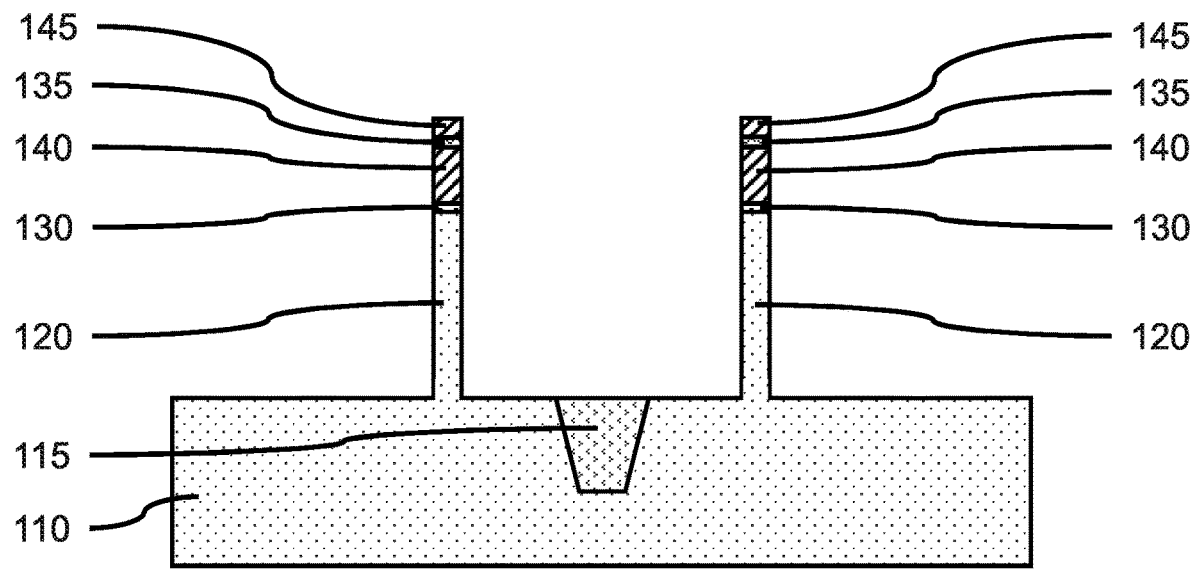
FIG. 13 is a cross-sectional side view showing two laterally adjacent vertical fins on a substrate, and an isolation region between the vertical fins, in accordance with another embodiment of the present invention.

FIG. 13 is a cross-sectional side view showing two laterally adjacent vertical fins on a substrate, and an isolation region between the vertical fins, in accordance with another embodiment of the present invention.

In various embodiments, the isolation region 115 can include two orthogonal sections that intersect between the vertical fins 120, such that each of the vertical fins 120 in a 2×2 array are separated by an intervening isolation region 115. The isolation region 115 can have a depth sufficient to electrically isolate source/drain regions formed in the substrate on opposite sides.

FIG. 14 is a cross-sectional side view showing the long axis of two neighboring co-linear vertical fins with fin templates on each of the vertical fins, and a masking layer on the vertical fins, substrate, and isolation region, in accordance with another embodiment of the present invention.

In various embodiments, a masking layer 152 can be formed on the substrate, 110, isolation region 115, fin templates, and neighboring co-linear vertical fins 120 and adjacent vertical fins 120. The masking layer 152 can be formed by a conformal deposition (e.g., ALD, PEALD).

The masking layer 152 can be a dielectric material. In various embodiments, the masking block 150 can be silicon oxide ($SiO_x$). The masking layer 152 can undergo a post-formation nitridation to form a silicon oxynitride ($Si_xO_yN_z$), where the masking layer material is different from the layers of the fin template.

In various embodiments, the masking layer 152 can have a thickness in the range of about 1 nm to about 20 nm, or in a range of about 2 nm to about 10 nm.

In various embodiments, the masking layer 152 can cover the sidewalls and end walls of the vertical fins 120 forming the fin array, cover the isolation region 115, and cover the substrate 110 surrounding the vertical fins.

In one or more embodiments, the masking layer 152 can be masked using lithographic processes, and etched to remove portions of the masking layer 152 on the vertical fins 120, fin templates, isolation region 115, and substrate 110. A portion of the masking layer 152 can remain on the substrate 110, an intersecting portion of the isolation region 115, and portions of the fin templates and vertical fins 120 to form a masking layer section 155.

Figure 15:
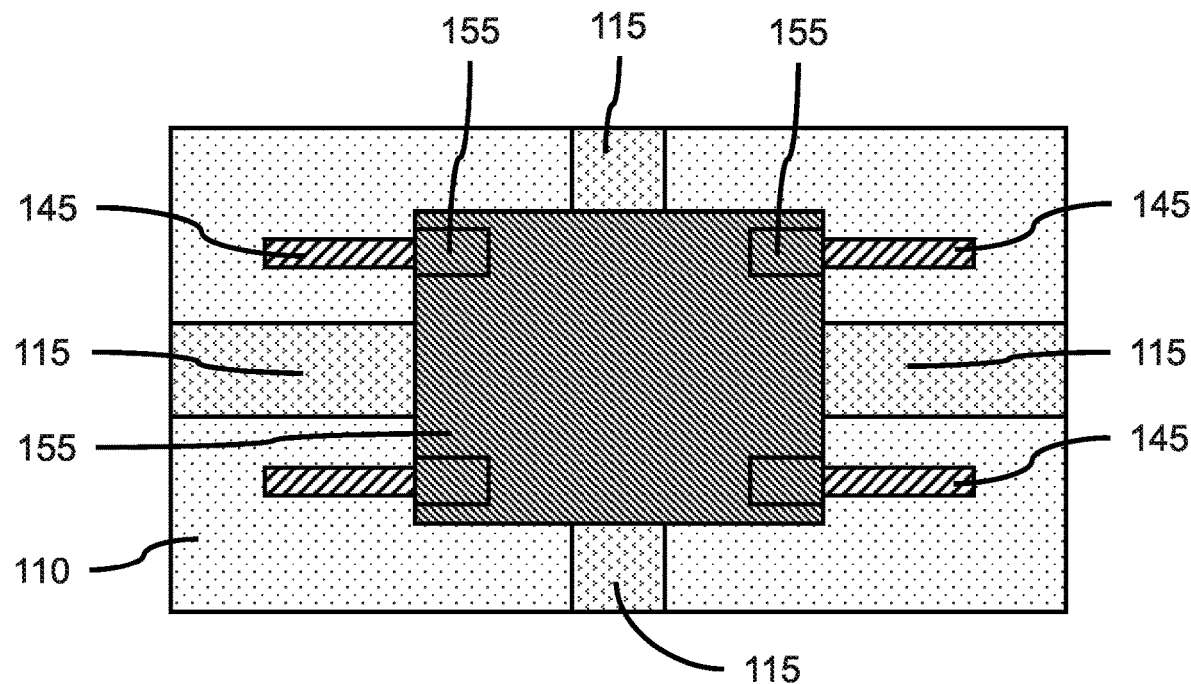
FIG. 15 is a top view showing the masking layer section on a portion of the vertical fins, substrate, and isolation region, in accordance with an embodiment of the present invention.

FIG. 15 is a top view showing the masking layer section on a portion of the vertical fins, substrate, and isolation region, in accordance with an embodiment of the present invention.

The masking layer section 155 can cover a region of the substrate between the neighboring co-linear vertical fins 120, and the region of the substrate 110 between the adjacent vertical fins 120. A portion of the masking layer section 155 can extend outward a predetermined distance from the sidewalls of each of the vertical fins 120 to cover an adjacent portion of the substrate 110. A portion of the masking layer section 155 can remain on a portion of the vertical fins 120 and fin templates closest to a neighboring co-linear vertical fin, such that the masking layer section can prevent formation of a bottom source/drain region that could overlap two adjacent substrate regions.

In various embodiments, the masking layer section 155 can have a width (perpendicular to the long axis of two neighboring co-linear vertical fins) in the range of about 10 nm to about 1000 nm, or about 20 nm to about 500 nm, where the masking layer section 155 is sufficiently large to protect the active fin end and substrate adjacent to the vertical fins(s), where the smallest device can include one (1) vertical fin and an adjoining bottom source/drain.

In various embodiments, a spacer layer 160 can be formed on the exposed surface of the substrate 110, the isolation region 115, the exposed surfaces of the vertical fins 120, and the layers of the fin templates, where the spacer layer 160 can be formed by a conformal deposition, for example, atomic layer deposition (ALD), plasma enhanced ALD (PEALD), or a combination thereof.

In various embodiments, the spacer layer 160 can have a thickness in the range of about 5 nm to about 50 nm, or in a range of about 20 nm to about 40 nm, although other thicknesses are also contemplated. The thickness of the spacer layer 160 can determine a height of the sidewalls and end walls of a vertical fin 120 that becomes exposed when the spacer layer 160 is removed.

In various embodiments, the spacer layer 160 can be a dielectric material (e.g., $SiO_x$, $Si_xN_y$, etc.). The spacer layer 160 can form steps over the edges of the masking layer section 155, where the spacer layer 160 can cover the masking layer section 155 and exposed surfaces of the second hardmask layer 145, isolation region 115, and substrate 110.

In one or more embodiments, a protective liner 170 can be formed on the spacer layer 160, where the protective liner 170 can be formed by a conformal deposition (e.g., ALD, PEALD).

The protective liner 170 can be a dielectric material (e.g., $SiO_x$, $Si_xN_y$, etc.). The protective liner 170 can be a different material from the spacer layer 160 and masking layer section 155.

The protective liner 170 can have a thickness in the range of about 1 nm to about 20 nm, or in a range of about 2 nm to about 10 nm, although other thicknesses are also contemplated. The thickness of the protective liner 170 can be the same as, less than, or greater than the thickness of the spacer layer 160. The protective liner 170 can form steps over the edges of the masking layer section 155 and steps in the spacer layer 160.

Figure 16:
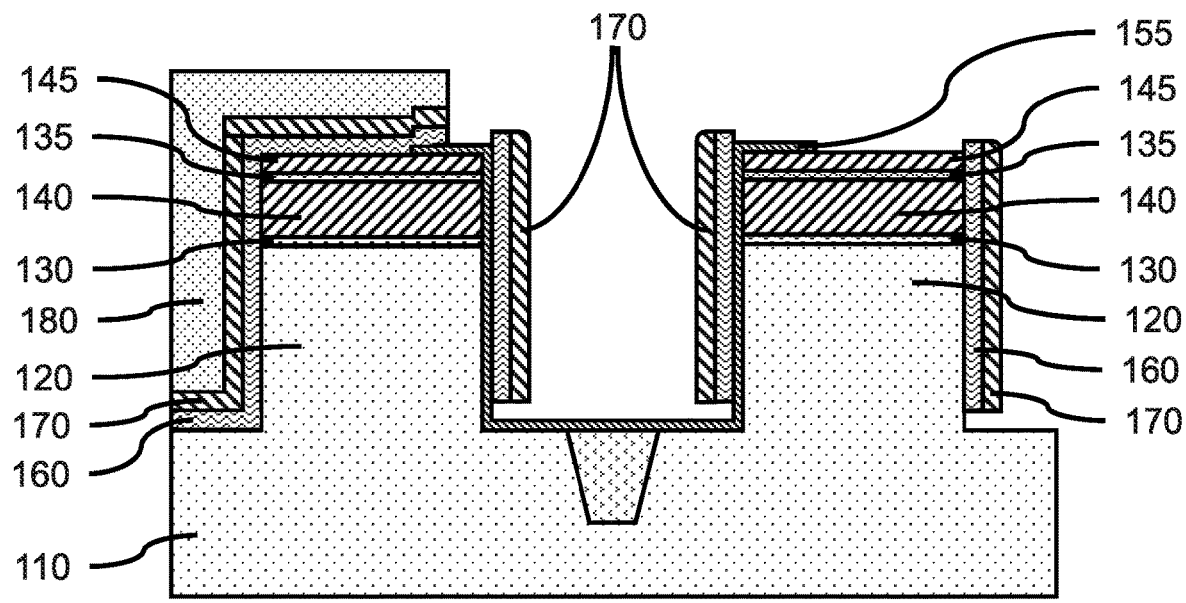
FIG. 16 is a cross-sectional side view showing the long axis of two neighboring co-linear vertical fins with a cover block, and portions of the exposed spacer layer and protective liner removed, in accordance with another embodiment of the present invention.

FIG. 16 is a cross-sectional side view showing the long axis of two neighboring co-linear vertical fins with a cover block, and portions of the exposed spacer layer and protective liner removed, in accordance with another embodiment of the present invention.

In various embodiments, a cover block 180 can be formed on two vertical fins 120 and on portions of the protective liner 170, spacer layer 160, and masking layer section 155 on a first side of the isolation region 115. Portions of the protective liner 170 on two first vertical fin 120 and on the masking layer section 155 can be exposed on a second side of the isolation region 115 opposite the first side with the cover block 180. The cover block 180 can cover a portion of the protective liner 170 on the substrate 110. The portion of the protective liner 170 between the neighboring co-linear vertical fins and adjacent vertical fins can be exposed.

In one or more embodiments, the portions of the protective liner 170 exposed by the cover block 180 can be removed, where the portions of the protective liner 170 can be removed by a selective, directional etch, for example a reactive ion etch (RIE). The reactive ion etch can remove portions of the protective liner 170 on surfaces approximately orthogonal to the direction of the ion beam, such that portions of the protective liner 170 can remain on the spacer layer 160, sidewalls and end walls of the vertical fins 120, while portions of the protective liner 170 on the masking layer section 155 covering the intersecting portion of the isolation region 115, and second hardmask layer 145 of the fin template can be removed.

In one or more embodiments, exposed portions of the spacer layer 160 can be removed using an isotropic etch, for example, a wet chemical etch, a dry plasma etch, or a combination thereof. The isotropic etch can remove portions of the spacer layer 160 on the substrate 110, and lower portions of the sidewalls and end walls of the vertical fins 120 shadowed by portions of the protective liner 170. Removal of the shadowed portions of the spacer layer 160 can expose the lower portions of the vertical fin 120 and adjacent portions of the substrate 110. Removal of portions of the spacer layer 160 can also expose a portion of the masking layer section 155.

In various embodiments, portions of the masking layer section 155 can remain on portions of the lower portion of the sidewalls and end walls of the vertical fins 120, and on adjacent portions of the substrate 110 extending away from the sidewalls and end walls of the vertical fins 120. Portions of the vertical fins 120 not covered by the masking layer section 155 can become exposed by removal of portions of the spacer layer 160.

Figure 17:
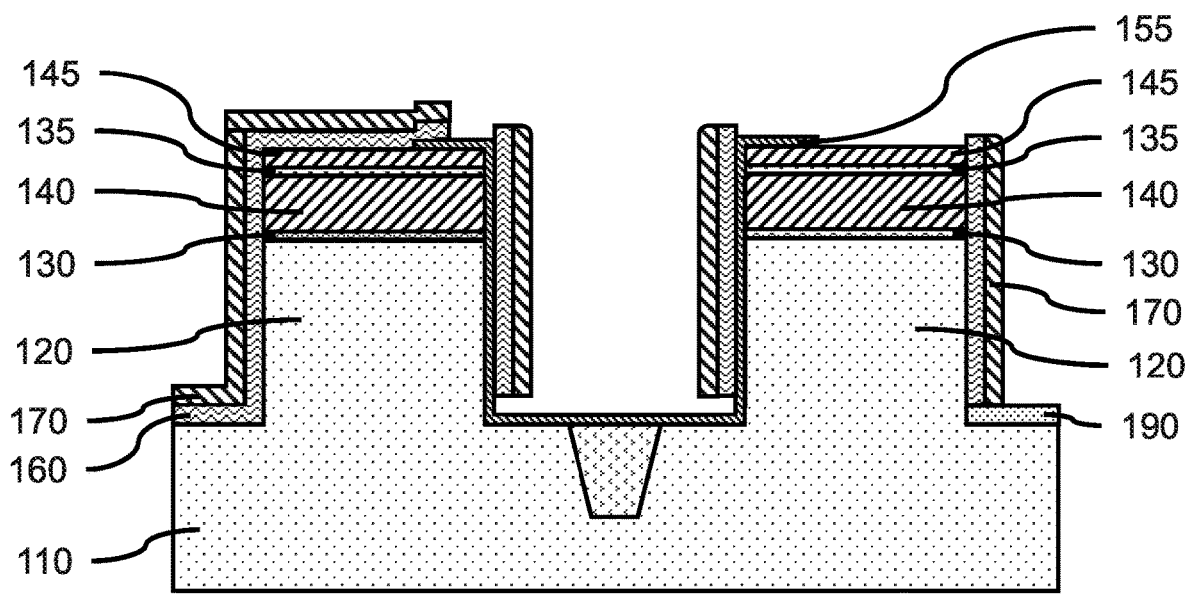
FIG. 17 is a cross-sectional side view showing the long axis of two neighboring co-linear vertical fins with a first bottom source/drain layer formed on an exposed portion of the substrate adjoining a vertical fin, in accordance with another embodiment of the present invention.

FIG. 17 is a cross-sectional side view showing the long axis of two neighboring co-linear vertical fins with a first bottom source/drain layer formed on an exposed portion of the substrate adjoining a vertical fin, in accordance with another embodiment of the present invention.

In various embodiments, the cover block 180 can be removed by a selective etch.

In various embodiments, a first bottom source/drain layer 190 can be formed on the surface of the substrate 110 exposed by removal of the spacer layer 160 from around the vertical fins 120 and not covered by the masking layer section 155. The first bottom source/drain layer 190 can be formed on the second side of the isolation region 115 opposite the first side.

The first bottom source/drain layer 190 can be formed by epitaxial or heteroepitaxial growth on a crystalline surface of the substrate 110. The first bottom source/drain layer 190 can be doped to form an n-type or p-type bottom source/drain. The first bottom source/drain layer 190 can have a dopant concentration in a range of about $5\times10^{19}$ to about $8\times10^{20}$.

In various embodiments, the first bottom source/drain layer 190 can be a semiconductor material, including, but not limited to n-type (e.g., P or As) doped silicon (Si) or p-type (e.g., B) doped silicon-germanium (SiGe).

In various embodiments, the masking layer section 155 can prevent formation of the first bottom source/drain layer 190 in a predefined region of the gap between the neighboring co-linear vertical fins and adjacent vertical fins 120, such that the first bottom source/drain layer 190 does not surround the vertical fins on the second side of the isolation region 115.

In various embodiments, the first bottom source/drain layer 190 can have a thickness in the range of about 5 nm to about 50 nm, or in a range of about 20 nm to about 40 nm, although other thicknesses are also contemplated. In various embodiments, the first bottom source/drain layer 190 can cover the exposed lower portion of the adjoining vertical fins 120.

In various embodiments, the first bottom source/drain layer 190 can be formed in the gap between the adjacent vertical fins 120 except for the isolation region. The first bottom source/drain layer 190 can be in physical and electrical contact with the exposed portion of the lower portion of a vertical fin 120 on each of the opposite sides of the isolation region.

Figure 18:
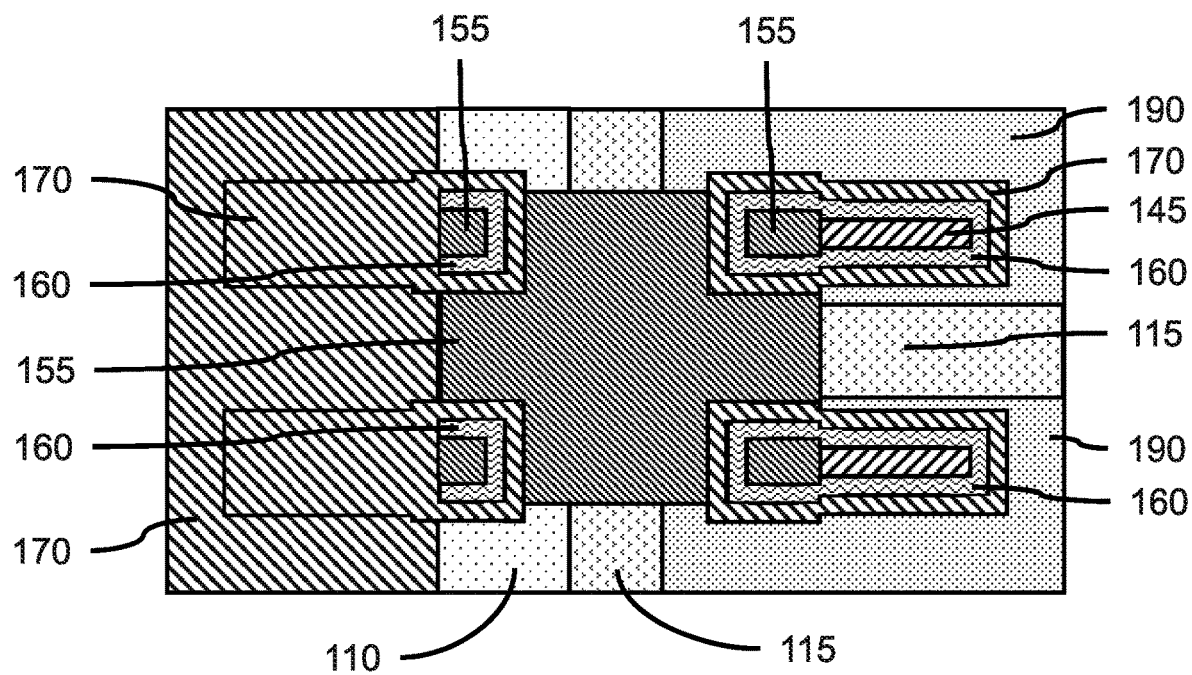
FIG. 18 is a top view showing the first bottom source/drain layer adjacent to the masking layer section and the vertical fins and spacer layer segments, in accordance with an embodiment of the present invention.

FIG. 18 is a top view showing the first bottom source/drain layer adjacent to the masking layer section and the vertical fins and spacer layer segments, in accordance with an embodiment of the present invention.

The isolation region 115 can electrically separate two regions of the first bottom source/drain layer 190 formed on the substrate 110. The masking layer section 155 on a portion of the vertical fins, substrate, and isolation region can prevent formation of a first bottom source/drain layer 190 completely surrounding the vertical fins 120, such that the first bottom source/drain layer 190 can adjoin the vertical fins on three sides, but the end wall(s) facing the isolation region 115 is/are not in contact with the first bottom source/drain layer 190.

In various embodiments, a guard layer 197 can be formed on the first bottom source/drain layer 190. The guard layer 197 can be an oxide layer formed by oxidation of the exposed first bottom source/drain layer 190.

In various embodiments, the remaining portions of the protective liner 170 exposed by removal of the cover block 180 can be removed to expose the remaining portions of the spacer layer.

In various embodiments, a second protective liner 200 can be reformed over the exposed surfaces, and a second cover block 210 formed over the vertical fins 120 on the second side of the isolation region. Portions of the second protective liner 200 exposed by the second cover block 210, and portions of the underlying spacer layer 160 can be removed to expose the portion of the substrate not covered by the masking layer section 155 on the first side.

In one or more embodiments, a second bottom source/drain layer 220 can be formed on the surface of the substrate 110 exposed by removal of the spacer layer 160 from around the vertical fins 120 on the first side. The second bottom source/drain layer 220 can be formed by epitaxial or heteroepitaxial growth on a crystalline surface of the substrate 110. The second bottom source/drain layer 220 can have the same crystal structure and orientation as the underlying substrate 110. The second bottom source/drain layer 220 can be doped to form an n-type or p-type bottom source/drain, where the doping of the second bottom source/drain layer 220 can be opposite the type of doping of the first bottom source/drain layer 190. The second bottom source/drain layer 220 can have a dopant concentration in a range of about $5\times10^{19}$ to about $8\times10^{20}$. The second bottom source/drain layer 220 can be a semiconductor material, including, but not limited to n-type (e.g., P or As) doped silicon (Si) or p-type (e.g., B) doped silicon-germanium (SiGe).

Figure 19:
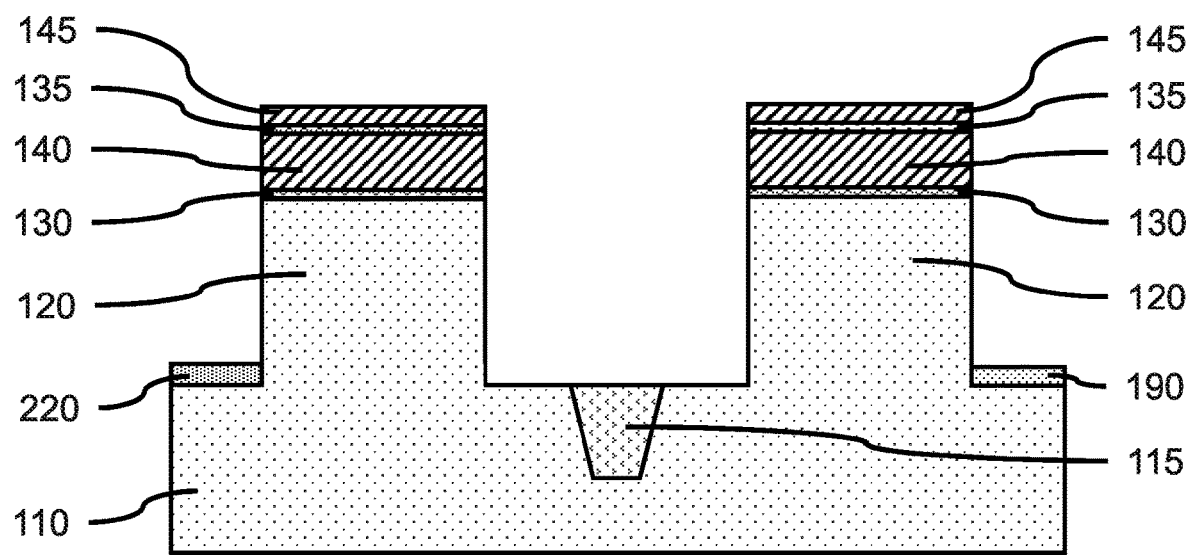
FIG. 19 is a cross-sectional side view showing the long axis of two neighboring co-linear vertical fins with a second bottom source/drain layer formed on an exposed portion of the substrate adjoining a vertical fin after removing the second protective liner, spacer layer, and masking layer section, in accordance with another embodiment of the present invention.

FIG. 19 is a cross-sectional side view showing the long axis of two neighboring co-linear vertical fins with a second bottom source/drain layer formed on an exposed portion of the substrate adjoining a vertical fin after removing the second protective liner, spacer layer, and masking layer section, in accordance with another embodiment of the present invention.

In various embodiments, the masking layer section 155 can prevent formation of the second bottom source/drain layer 220 in a predefined region of the gap between the neighboring co-linear vertical fins and adjacent vertical fins 120, such that the second bottom source/drain layer 220 does not surround the vertical fins on the first side of the isolation region 115.

In various embodiments, the second bottom source/drain layer 220 can have a thickness in the range of about 5 nm to about 50 nm, or in a range of about 20 nm to about 40 nm.

Figure 20:
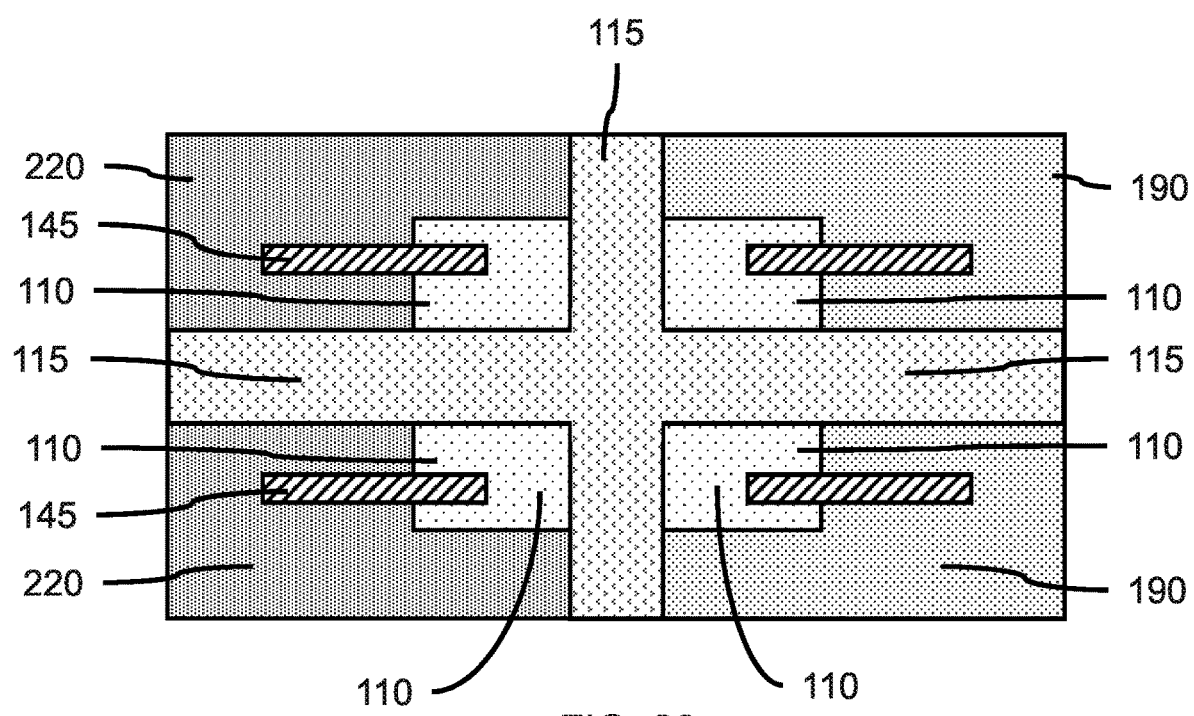
FIG. 20 is a top view showing vertical fins, exposed portions of the substrate, first bottom source/drain layer, and second bottom source/drain layer, in accordance with an embodiment of the present invention.

FIG. 20 is a top view showing vertical fins, exposed portions of the substrate, first bottom source/drain layer, and second bottom source/drain layer, in accordance with an embodiment of the present invention.

The isolation region 115 can electrically separate two regions of the second bottom source/drain layer 220 formed on the substrate 110 on the first side. The masking layer section 155 on a portion of the vertical fins, substrate, and isolation region can prevent formation of a second bottom source/drain layer 220 completely surrounding the vertical fins 120, such that the second bottom source/drain layer 220 can adjoin the vertical fins on three sides, but the end wall(s) facing the isolation region 115 is/are not in contact with the second bottom source/drain layer 220. In various embodiments, the second cover block 210, second protective liner 200, spacer layer 160, and masking layer section 155 can be removed to expose the substrate 110 in the gap between the edges of the first bottom source/drain layer 190 or second bottom source/drain layer 220, and the isolation region, that does not have a source/drain layer on it.

What is claimed is:

1. A pair of co-linear vertical fin field effect devices, comprising:
   a first vertical fin on an n-doped first bottom source/drain, wherein the first bottom source/drain is in a semiconductor substrate;
   a second vertical fin on a p-doped second bottom source/drain, wherein the first vertical fin is co-linear with the second vertical fin;
   an inactive separation region between an edge of the n-doped first bottom source/drain and an edge of the p-doped second bottom source/drain; and
   a lightly doped semiconductor region in the semiconductor substrate under the inactive separation region and between the n-doped first bottom source/drain and p-doped second bottom source/drain, wherein the lightly doped semiconductor region includes a p-n-junction.

2. The pair of co-linear vertical fin field effect devices of claim 1, wherein the first vertical fin is separated from the second vertical fin by a distance in a range of about 10 nm to about 100 nm, and the inactive separation region has a width of about 5 nm to about 50 nm between the first vertical fin and second vertical fin.

3. The pair of co-linear vertical fin field effect devices of claim 1, wherein the lightly doped semiconductor region has a combined dopant concentration in a range of about $1\times10^{17}$ to about $1\times10^{18}$ at a minimum interface point.

4. The pair of co-linear vertical fin field effect devices of claim 3, wherein the n-doped first bottom source/drain has a dopant concentration in a range of about $5\times10^{19}$ $cm^{-3}$ to about $8\times10^{20}$ $cm^{-3}$, and the p-doped second bottom source/drain has a dopant concentration in a range of about $5\times10^{19}$ $cm^{-3}$ to about $8\times10^{20}$ $cm^{-3}$.

5. A pair of co-linear vertical fin field effect devices, comprising:
   a first vertical fin on a substrate;
   a second vertical fin on the substrate, wherein the first vertical fin is co-linear with the second vertical fin;
   an isolation region in the substrate between the first vertical fin and second vertical fin;
   a first bottom source/drain on the substrate adjacent to the first vertical fin, wherein the first bottom source/drain adjoins sidewall portions of the first vertical fin on three sides, but does not laterally surround the first vertical fin; and
   a second bottom source/drain on the substrate adjacent to the second vertical fin, wherein the second bottom source/drain adjoins sidewall portions of the second vertical fin on three sides, but does not laterally surround the second vertical fin.

6. The pair of co-linear vertical fin field effect devices of claim 5, wherein the first bottom source/drain layer is n-doped and the second bottom source/drain layer is p-doped.

7. The pair of co-linear vertical fin field effect devices of claim 5, wherein the isolation region includes two orthogonal sections that intersect.

8. The pair of co-linear vertical fin field effect devices of claim 5, wherein the first bottom source/drain layer has a thickness in the range of about 5 nm to about 50 nm, and the second bottom source/drain layer has a thickness in the range of about 5 nm to about 50 nm.

9. The pair of co-linear vertical fin field effect devices of claim 5, wherein the first vertical fin is separated from the second vertical fin by a distance in a range of about 10 nm to about 100 nm.

10. The pair of co-linear vertical fin field effect devices of claim 5, wherein the first bottom source/drain has a dopant concentration in a range of about $5\times10^{19}$ $cm^{-3}$ to about $8\times10^{20}$ $cm^{-3}$, and the second bottom source/drain has a dopant concentration in a range of about $5\times10^{19}$ $cm^{-3}$ to about $8\times10^{20}$ $cm^{-3}$.

* * * * *